(12) United States Patent
Schmitt (10) Patent No.: US 10,905,033 B2
(45) Date of Patent: Jan. 26, 2021

(54) LIQUID-COOLED ELECTRIC DRIVE COMPONENT, POWERTRAIN, VEHICLE AND METHOD

(71) Applicant: SIEMENS AKTIENGESELLSCHAFT, Munich (DE)

(72) Inventor: Matthias Schmitt, Schwabach (DE)

(73) Assignee: SIEMENS AKTIENGELLSCHAFT, Munich (DE)

(*) Notice: Subject to any disclaimer, the term of this patent is extended or adjusted under 35 U.S.C. 154(b) by 142 days.

(21) Appl. No.: 15/381,986

(22) Filed: Dec. 16, 2016

(65) Prior Publication Data

US 2017/0181332 A1 Jun. 22, 2017

(30) Foreign Application Priority Data

Dec. 18, 2015 (DE) .................. 10 2015 226 023

(51) Int. Cl.
| | | |
|---|---|---|
| *H05K 7/20* | (2006.01) | |
| *F01N 5/02* | (2006.01) | |
| *F28D 15/02* | (2006.01) | |
| *G06F 1/20* | (2006.01) | |
| *H01L 23/467* | (2006.01) | |
| *H01L 23/427* | (2006.01) | |

(Continued)

(52) U.S. Cl.
CPC ........... *H05K 7/20927* (2013.01); *B60K 1/00* (2013.01); *F01N 5/025* (2013.01); *F28D 15/02* (2013.01); *G06F 1/20* (2013.01); *H01L 23/427* (2013.01); *H01L 23/467* (2013.01); *H01L 23/473* (2013.01); *H02K 1/20* (2013.01); *H02K 5/20* (2013.01); *H05K 7/20154* (2013.01); *H05K 7/20872* (2013.01); *H05K 7/20918* (2013.01); *B60K 11/02* (2013.01); *B60K 2001/006* (2013.01); *B60Y 2410/10* (2013.01); *B60Y 2410/124* (2013.01)

(58) Field of Classification Search
CPC .......... H05K 7/20927; H05K 7/20918; H05K 7/20154; H05K 7/20872; H02K 5/20; H02K 1/20; H01L 23/473; H01L 23/427; H01L 23/467; G06F 1/20; F28D 15/02; F01N 5/025; B60K 1/00; B60K 11/02; B60K 2001/006; B60Y 2410/124; B60Y 2410/10
USPC .......................................................... 361/719
See application file for complete search history.

(56) References Cited

U.S. PATENT DOCUMENTS

| | | | | |
|---|---|---|---|---|
| 2012/0250254 A1* | 10/2012 | Kojyo | ............... | H05K 7/20918 361/692 |
| 2014/0098588 A1* | 4/2014 | Kaneko | ............... | H02M 7/003 363/141 |

(Continued)

FOREIGN PATENT DOCUMENTS

| | | |
|---|---|---|
| DE | 102006044785 A1 | 4/2008 |
| DE | 102010040399 A1 | 3/2012 |

(Continued)

*Primary Examiner* — Anatoly Vortman
*Assistant Examiner* — Zhengfu J Feng
(74) *Attorney, Agent, or Firm* — Henry M. Feiereisen LLC (57) ABSTRACT

A liquid-cooled electric drive component for a powertrain of a vehicle includes a first housing part and a second housing part. The first and second housing parts are joined to one another by a fluid-tight welded joint and configured such as to form at least a segment of a cooling duct. The vehicle can be a hybrid vehicle or an electric vehicle.

18 Claims, 6 Drawing Sheets

(51) Int. Cl.
*H01L 23/473* (2006.01)
*H02K 1/20* (2006.01)
*H02K 5/20* (2006.01)
*B60K 1/00* (2006.01)
*B60K 11/02* (2006.01)

(56) References Cited

U.S. PATENT DOCUMENTS

2014/0225249 A1* 8/2014 Yoshihara ............ H01L 23/4334
  257/714
2015/0375596 A1* 12/2015 Blain .................... B60K 11/04
  165/47

FOREIGN PATENT DOCUMENTS

DE   102010042259 A1   4/2012
DE   102012023050 A1   5/2014
WO     WO 9310935 A1   6/1993

* cited by examiner

LIQUID-COOLED ELECTRIC DRIVE COMPONENT, POWERTRAIN, VEHICLE AND METHOD

CROSS-REFERENCES TO RELATED APPLICATIONS

This application claims the priority of German Patent Application, Serial No. 102015226023.2, filed Dec. 18, 2015, pursuant to 35 U.S.C. 119(a)-(d), the content of which is incorporated herein by reference in its entirety as if fully set forth herein.

BACKGROUND OF THE INVENTION

The invention relates in general to a liquid-cooled electric drive component for a powertrain of a vehicle, in particular, of a hybrid vehicle or electric vehicle.

The following discussion of related art is provided to assist the reader in understanding the advantages of the invention, and is not to be construed as an admission that this related art is prior art to this invention.

Drive components find use in numerous applications. In these applications, cooling ducts through which a liquid flows usually must be sealed to prevent the coolant escaping. In previous solutions, cooling ducts were screw-fastened using an insert seal or an adhesive seal. Insert seals in the form of O-rings or of dispensed adhesive seals are used, for example. In order to be able to achieve the required surface finishes for the seal, the surfaces to be sealed usually require mechanical finishing, for instance by milling or other machining steps.

It would therefore be desirable and advantageous to provide an improved liquid-cooled electric drive component which obviate prior art shortcomings and which enable a simple and reliable construction for conducting coolant in a liquid-cooled electric drive component.

SUMMARY OF THE INVENTION

According to one aspect of the invention, a liquid-cooled electric drive component for a powertrain of a vehicle includes a first housing part and a second housing part, the first and second housing parts being joined to one another by a fluid-tight welded joint and configured such as to form at least a segment of a cooling duct.

According to another aspect of the invention, a method for producing a liquid-cooled electric drive component includes die-casting a first housing part, placing a second housing part on a contact surface of the first housing part, and joining the first and second housing parts by a fluid-tight welded joint at the contact surface.

According to still another aspect of the invention, a powertrain for a vehicle includes a liquid-cooled electric drive component, as set forth above.

According to still another aspect of the present invention, a vehicle includes a liquid-cooled electric drive component, as set forth above, and/or a powertrain as set forth above.

The particular segment of the cooling duct, or the cooling duct, is encased by the first housing part and the corresponding second housing part. The first and second housing parts are joined together reliably by the fluid-tight welded joint. At the same time, the fluid-tight welded joint achieves a simple, reliable construction for conducting the coolant by using a simple and reliable fluid-tight design for the particular segment of the cooling duct or for the cooling duct. In particular, the cross-section of the cooling duct is defined by recesses in the wall of the first housing part and/or of the corresponding second housing part. The cooling duct is intended to conduct the coolant, and in particular comprises a duct inlet and a duct outlet.

Advantageously, at least the first housing part can be designed to be concave in part, with the concave configuration being arranged in particular between a duct inlet and a duct outlet. When the first housing part designed in this way is joined to the second housing part, a cavity is formed, which constitutes the particular segment of the cooling duct, or the cooling duct. In this case, the second housing part is advantageously substantially flat, i.e. in the form of a plate.

With the proposed drive component and/or the proposed method, it is possible to save on some work steps and parts for the drive component compared to previous designs. In particular, seals and screws may no longer be needed, dispensing with correct insertion of the seals and screwing together the two housing parts. This simplifies the manufacture of the proposed drive component, hence also making it cheaper to manufacture while simultaneously eliminating potential sources of manufacturing errors.

The proposed drive component may be in the form of, for example, an electric motor.

According to another advantageous feature of the present invention, the first and second housing parts can be joined by laser beam welding or by friction stir welding to establish the fluid-tight welded joint. In the event, a plurality of second housing parts are provided, they may, optionally, also be joined to one another by welding, in particular, by laser beam welding or friction stir welding.

Laser beam welding can be used to produce a good joint even between housing parts that have a more complicated design. One of the reasons for this is that even otherwise hard-to-reach points can be welded. Another advantage of using laser beam welding is that comparatively little energy is transmitted into the housing part which thus becomes less distorted.

Friction stir welding, like laser beam welding, has the advantage that there is relatively little distortion of the housing part because relatively low temperatures are applied. In addition, friction stir welding does not require filler materials or shielding gas, yet can still produce extremely resilient seams.

According to another advantageous feature of the present invention, the first housing part can include a material which is different from a material of the second housing part. Examples of materials that may be contemplated include metals or alloys. For example, the material of the first housing part may include mainly aluminum, and the material of the second housing part may include mainly steel.

According to another advantageous feature of the present invention, the first housing part can be a die-cast part and has a contact surface on which the second housing part can rest, with the fluid-tight welded joint being formed on the contact surface. The first housing part may be produced by a die-casting method, a drop-forging method or a forging method, and therefore, the first housing part can be a die-cast part. The second housing part may also be produced by a die-casting method, a drop-forging method or a forging method.

According to another advantageous feature of the present invention, the corresponding contact surface may hereby be untreated. The contact surface, in particular, in the context of the proposed method for producing the proposed liquid-cooled drive component, is in its untreated state when it is not machined before the first housing part is welded to the second housing part in a fluid-tight manner. In other words, the contact surface is untreated, in particular has not been machined, at the time of welding. An untreated contact surface has, for example, casting pores originating from a casting process used to produce the respective housing part.

The first housing part and the second housing part are preferably joined together by friction stir welding. It is particularly advantageous to use this welding technique here because for friction stir welding the parts to be welded do not require any pretreatment and hence there are also no particular requirements to be met regarding the corresponding surface finishes.

In particular, different materials may be used for the first housing part and the corresponding second housing part.

According to another advantageous feature of the present invention, the drive component can be constructed in the form of an inverter which includes at least one power module in thermal contact with the cooling duct, with the first housing part encasing at least part of the power module. For example, the power module may include one or more power semiconductors. Waste heat is produced in the power module during operation of the inverter and can be dissipated to the cooling duct, or the coolant in the cooling duct, as a result of the thermal contact of the power module with the cooling duct. The thermal contact can be established, for example, by placing the power module advantageously in surface-to-surface contact with the inside of the first housing part, and arranging the cooling duct on the outside of that region of the first housing part on which the power module is arranged on the inside.

According to another advantageous feature of the present invention, the power module can include a heat sink having at least one part which extends into the cooling duct. For this purpose, the first housing part can advantageously include a cutout through which the heat sink passes. The heat sink thus forms a relatively direct thermal interface between the rest of the power module and the cooling duct, or the coolant in the cooling duct. The coolant can thereby surround or flow around at least part of the heat sink, with the result that waste heat produced by the power module during operation can be conveyed effectively to the coolant.

Advantageously, the heat sink can include cooling prongs, cooling ribs and/or cooling fins in order to increase the surface area through which waste heat can be dissipated from the corresponding heat sink to the coolant. The heat sink may be joined to the first housing part by a further fluid-tight welded joint, e.g., by laser beam welding or friction stir welding.

According to another advantageous feature of the present invention, the first housing part may include an aperture, with the power module being arranged on one side of the aperture and the cooling duct being arranged on another side of the aperture, wherein a third housing part can be arranged in the aperture and include a third material having a thermal conductivity which is greater than a thermal conductivity of a material of the first housing part, with the first and third housing parts being joined to one another by a further fluid-tight welded joint, e.g. by laser beam welding or friction stir welding.

Thus a third housing part including a third material is introduced into the aperture in the first housing part. The third material has a comparatively good thermal conductivity. For example, copper or a copper alloy can be used here as the third material, which exists in the form of strands, in particular copper strands, for example. The third housing part and the first housing part can be joined together by friction stir welding, in particular because this welding technique is particularly well-suited to join different materials.

The aperture leading to the cooling duct can have, for example, a larger cross section than the corresponding power module, with the result that waste heat from the power module produced during operation can be dissipated over a relatively large surface to the cooling duct, or to the coolant in the cooling duct. The third housing part can include cooling prongs, cooling ribs and/or cooling fins in order to increase the cooling surface available.

The afore-described heat sink can be provided in addition to the third housing part. For example, the third housing part can have a cutout for passage of the heat sink, or the third housing part and the heat sink may be arranged side by side in the aperture of the first housing part. The contact surface of the corresponding heat sink can be joined to the third housing part by an additional fluid-tight welded joint, e.g., by laser beam welding or friction stir welding.

According to another advantageous feature of the present invention, the second housing part may be in the form of a molded sheet metal part, a casting, a drop-forged part or forged part. For example, the second housing part can thus be obtained by stamping of metal sheets. Steel sheets may advantageously be used for this purpose.

BRIEF DESCRIPTION OF THE DRAWINGS

Other features and advantages of the present invention will be more readily apparent upon reading the following description of currently preferred exemplified embodiments of the invention with reference to the accompanying drawings, in which.

DETAILED DESCRIPTION OF PREFERRED EMBODIMENTS

Throughout the figures, same or corresponding elements may generally be indicated by same reference numerals.

These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 1:
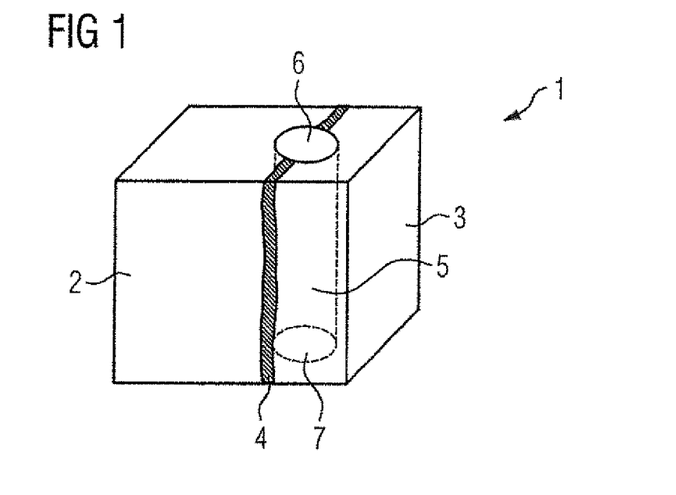
FIG. 1 is a perspective view of a first exemplary embodiment of a liquid-cooled electric drive component according to the present invention.

Turning now to the drawing to FIG. 1, there is shown a perspective view of a first exemplary embodiment of a liquid-cooled electric drive component according to the present invention, generally designated by reference numeral 1. The liquid-cooled electric drive component 1 includes a first housing part 2 and a second housing part 3, where the first housing part 2 and the second housing part 3 are joined together by a fluid-tight welded joint 4. The first housing part 2 and the second housing part 3, which is welded to the first housing part 2, are designed such that together they form a cooling duct 5. The cooling duct 5 is intended to conduct the coolant, and includes a duct inlet 6 and a duct outlet 7.

The fluid-tight welded joint 4 can be produced for example by laser beam welding or friction stir welding.

Advantageously, the first housing part 2 includes a first material, and the second housing part 3 includes a second material, wherein the first material and the second material are different.

In particular, the second housing part 3 is in the form of a molded sheet metal part, a casting, a drop-forged part or forged part.

As shown in FIG. 1, the cooling duct 5 can be created by the combination of the first housing part 2 and the second housing part 3. The liquid-cooled electric drive component 1 in this case has a parting plane in which the fluid-tight welded joint 4 is arranged and which separates the cooling duct 5 in the direction of flow of the coolant. For example, each of the first housing part 2 and the second housing part 3 includes a groove-shaped concave recess, thereby forming the cooling duct 5. The duct inlet 6 and the duct outlet 7 are thus surrounded in particular by the first housing part 2, the second housing part 3 and the fluid-tight welded joint 4. It is also possible that the one of the two housing parts has an approximately flat surface, and the other of the two housing parts has a concave surface, with the result that the cooling duct 5 is left as a cavity after the two housing parts are welded together.

Figure 2:
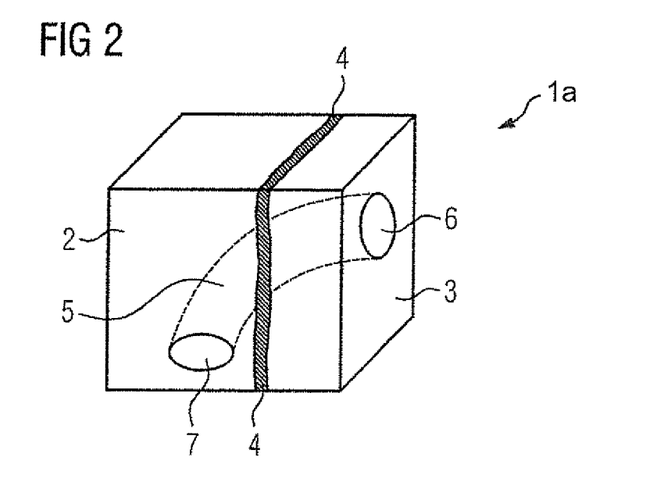
FIG. 2 is a perspective view of a second exemplary embodiment of a liquid-cooled electric drive component according to the present invention.
Figure 3:
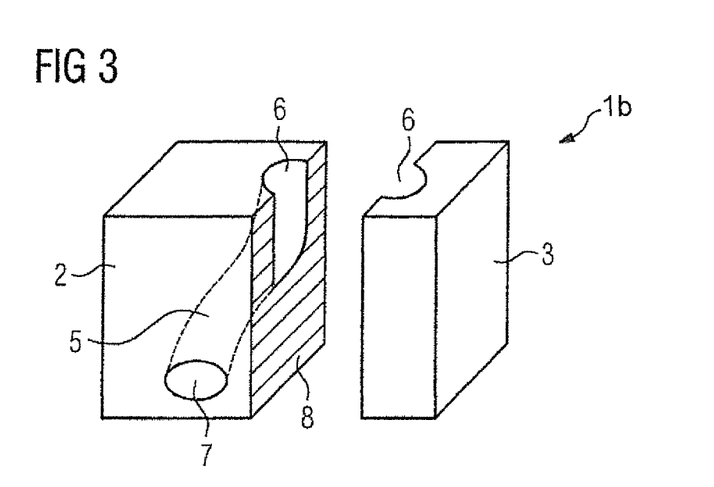
FIG. 3 is a perspective exploded view of a third exemplary embodiment of a liquid-cooled electric drive component according to the present invention.

Other embodiments are also feasible, as shown by way of example in FIG. 2 or 3. In particular, both the duct inlet 6 and the duct outlet 7 can also be arranged on a surface of one of the housing parts, with at least a portion of the cooling duct 5 running along a surface of the other of the housing parts.

FIG. 2 is a perspective view of a second exemplary embodiment of a liquid-cooled electric drive component according to the present invention, generally designated by reference numeral 1a. Parts corresponding with those in FIG. 1 are denoted by identical reference numerals and not explained again. The description below will center on the differences between the embodiments. In this embodiment, the cooling duct 5 has a different design. The duct inlet 6 is arranged on a surface of the second housing part 3, whereas the duct outlet 7 is arranged on a surface of the first housing part 2. Thus the cooling duct 5 extends from the second housing part 3 via the region containing the fluid-tight welded joint 4 to the first housing part 2. The liquid-cooled electric drive component 1 has a parting plane in which the fluid-tight welded joint 4 is arranged and which separates the cooling duct 5 at right angles to the direction of flow of the coolant.

FIG. 3 is a perspective exploded view of a third exemplary embodiment of a liquid-cooled electric drive component according to the present invention, generally designated by reference numeral 1b. For reasons of clarity, the drive component 1b is shown before the first housing part 2 has been welded to the second housing part 3 in a fluid-tight manner. In other respects the view corresponds to that of FIG. 1 or FIG. 2. The duct outlet 7 is arranged on a surface of the first housing part 2, whereas the duct inlet 6 is surrounded by the first housing part 2, the second housing part 3 and the fluid-tight welded joint 4 that is still to be made.

The first housing part 2 has a contact surface 8 on which the second housing part 3, which is to be welded to the first housing part 2, makes contact. The contact surface 8 is advantageously untreated, i.e. is not machined, when the second housing part 3 is joined to the first housing part 2 by the fluid-tight welded joint 4. In particular, the first housing part 2 is in the form of a die-cast part. The liquid-cooled electric drive component 1 has a parting plane in which the fluid-tight welded joint 4 is arranged. The parting plane in this case separates the cooling duct 5 in part in the direction of flow and in part at right angles to the direction of flow of the coolant.

Figure 4:
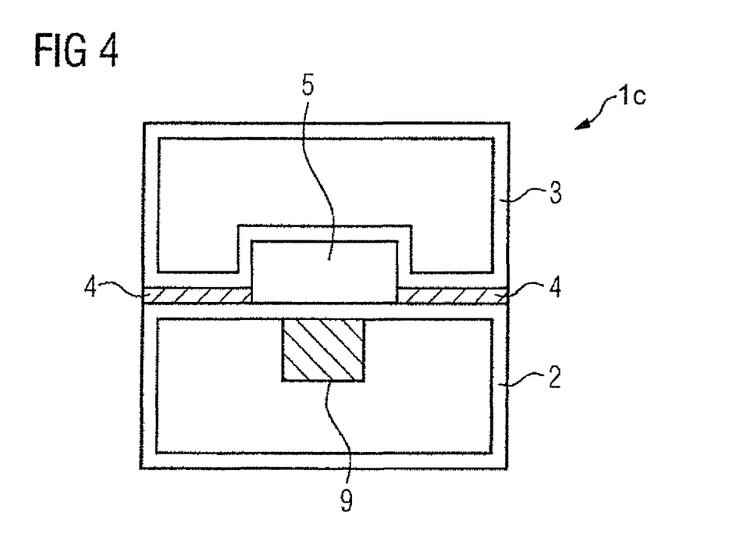
FIG. 4 is a cross-sectional view of a fourth exemplary embodiment of a liquid-cooled electric drive component according to the present invention.

FIG. 4 is a cross-sectional view of a fourth exemplary embodiment of a liquid-cooled electric drive component according to the present invention, generally designated by reference numeral 1c. The liquid-cooled electric drive component 1c is embodied as an inverter and includes a power module 9, at least part of which is encased by the first housing part 2. In this embodiment, the power module 9 is in thermal contact with the cooling duct 5. The thermal contact is created by the power module 9 lying in surface-to-surface contact with the inside of the first housing part 2, with the cooling duct 5 being arranged on the outside of that region of the first housing part 2 on which the power module 9 concerned is arranged on the inside.

Figure 5:
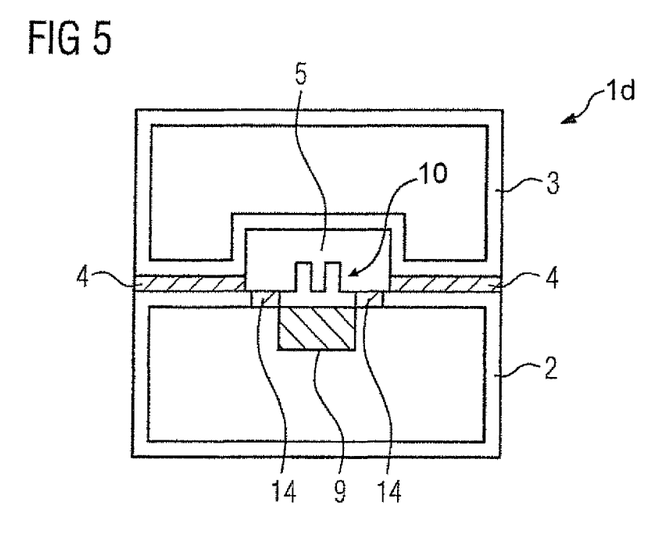
FIG. 5 is a cross-sectional view of a fifth exemplary embodiment of a liquid-cooled electric drive component according to the present invention.

FIG. 5 is a cross-sectional view of a fifth exemplary embodiment of a liquid-cooled electric drive component according to the present invention, generally designated by reference numeral 1d. Parts corresponding with those in FIG. 4 are again denoted by identical reference numerals. The liquid-cooled electric drive component 1d is embodied as an inverter and includes a power module 9, at least part of which is encased by the first housing part 2. In this embodiment, the power module 9 is in thermal contact with the cooling duct 5. The power module 9 includes a heat sink 10 which at least in part extends into the cooling duct 5. The heat sink 10 is joined to the first housing part 2 by a fluid-tight welded joint 14. The heat sink 10 can have cooling fins, as suggested in FIG. 5.

Figure 6:
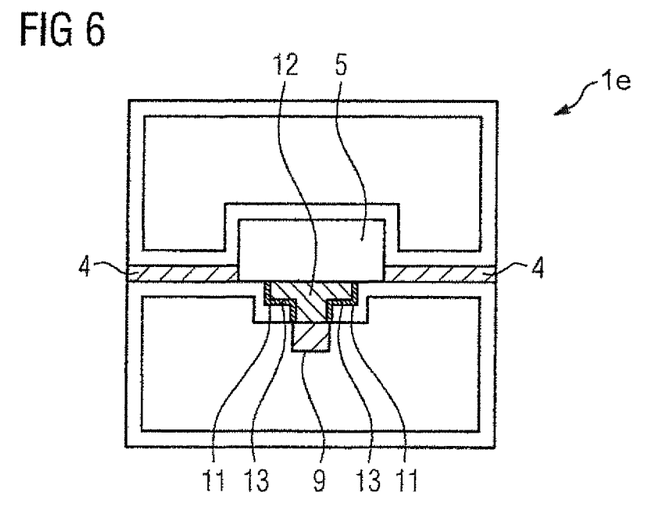
FIG. 6 is a cross-sectional view of a sixth exemplary embodiment of a liquid-cooled electric drive component according to the present invention.

FIG. 6 is a cross-sectional view of a sixth exemplary embodiment of a liquid-cooled electric drive component according to the present invention, generally designated by reference numeral 1e. Parts corresponding with those in FIGS. 4 and 5 are again denoted by identical reference numerals. The liquid-cooled electric drive component 1 is embodied as an inverter and includes a power module 9, at least part of which is encased by the first housing part 2, In this embodiment, the power module 9 is in thermal contact with the cooling duct 5.

The first housing part 2 includes an aperture 11, with the power module 9 arranged on the one side of the aperture 11, and the cooling duct 5 arranged on the other side of the aperture 11. In this case, a third housing part 12 including a third material that has a thermal conductivity greater than the thermal conductivity of the first material, is arranged in the aperture 11. The first housing part 2 includes the first material in this case. The third housing part 12 and the first housing part 2 are joined together by a further fluid-tight welded joint 13, e.g., by laser beam welding or friction stir welding.

For example, copper can be chosen as the third material, and therefore the third housing part 12 can be in the form of copper strands in particular. The third housing part 12 and the first housing part 2 are advantageously joined together by friction stir welding, in particular because this welding technique is particularly well-suited to joining different materials.

For example, the aperture 11 leading to the cooling duct 5 can have a larger cross section than the power module 9, with the result that the waste heat from the power module 9 produced during operation can be dissipated over a relatively large surface to the cooling duct 5, or to the coolant in the cooling duct 5.

In addition, provision may be made, for example, for the power module 9 to include a heat sink, at least part of which extends into the cooling duct 5, as was described in connection with the liquid-cooled electric drive component 1d in FIG. 5. It is possible in this case that the heat sink is enclosed by the third housing part 12, with the heat sink and the third housing part 12 being joined together in particular by a separate fluid-tight welded joint 13, for instance by laser beam welding or friction stir welding.

Figure 7:
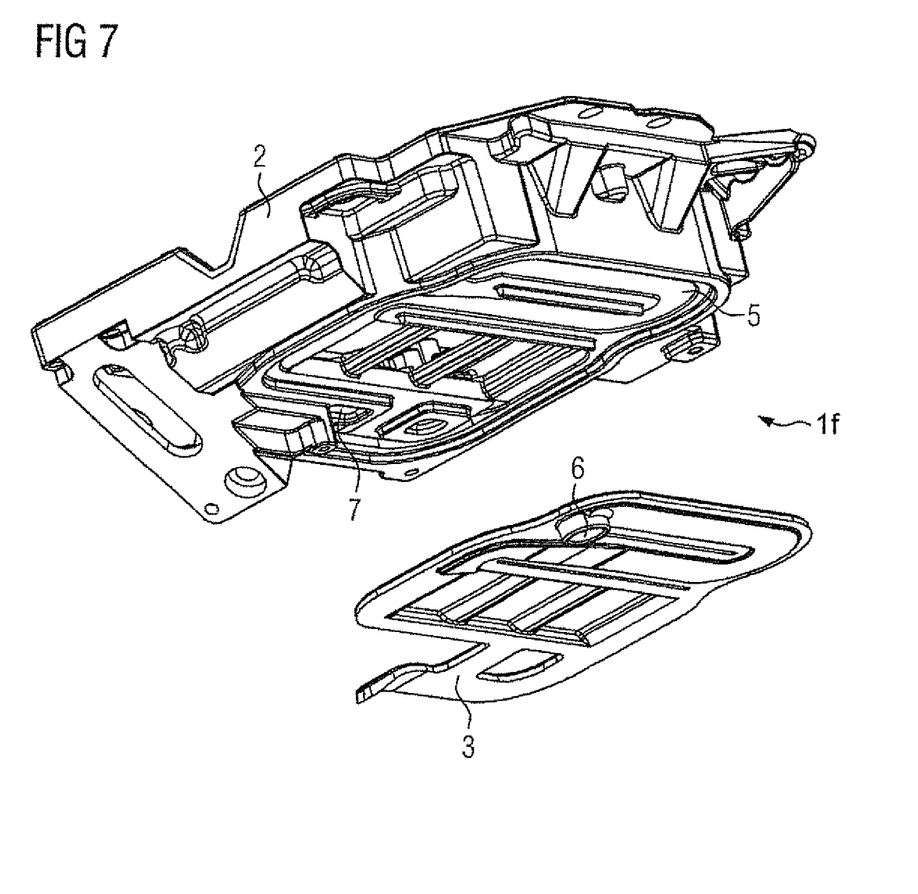
FIG. 7 is a perspective exploded view of a seventh exemplary embodiment of a liquid-cooled electric drive component according to the present invention.
Figure 8:
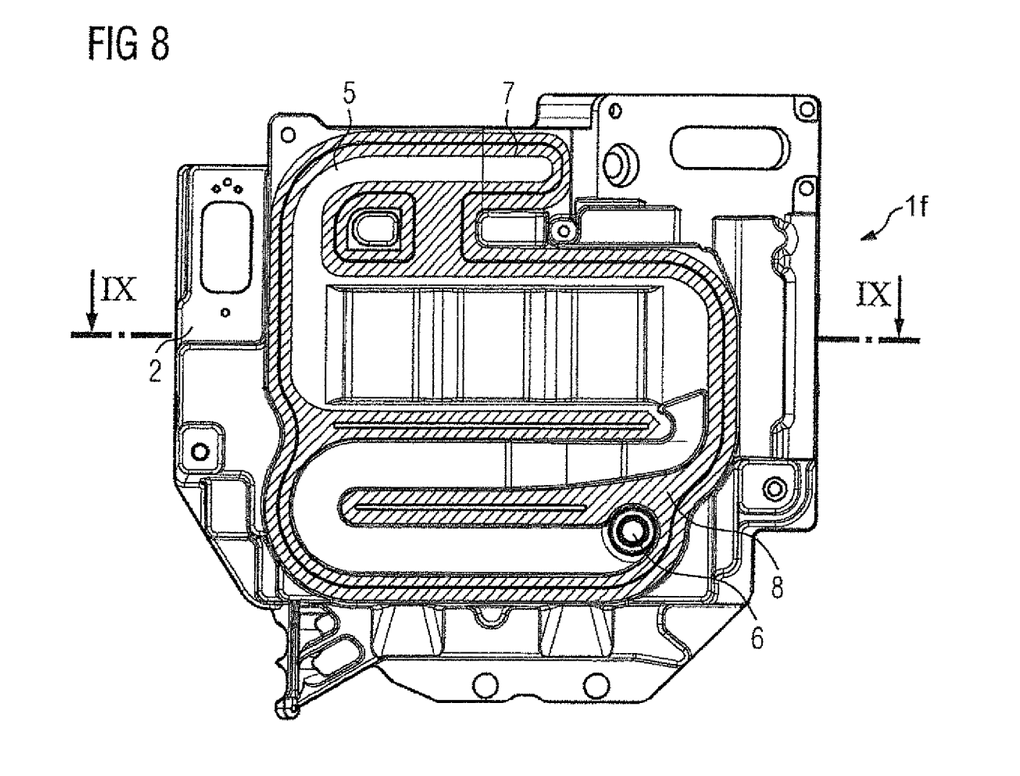
FIG. 8 is a plan view of the liquid-cooled electric drive component of FIG. 7.
Figure 9:
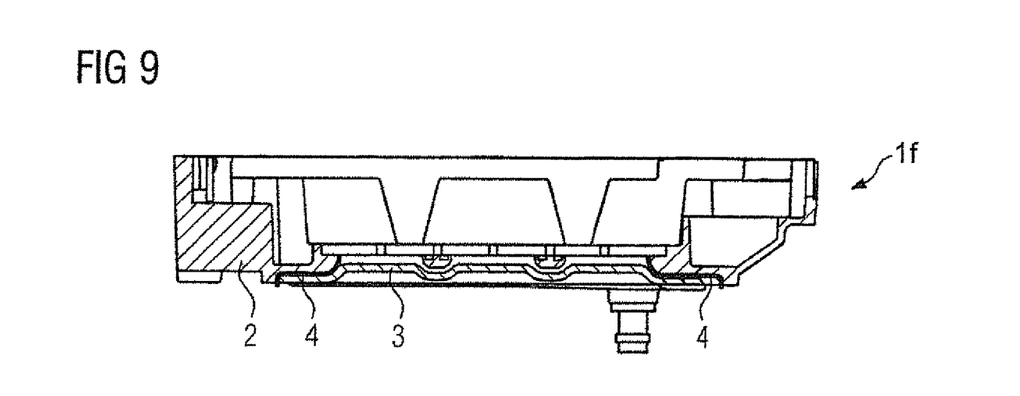
FIG. 9 is a cross-sectional view of the liquid-cooled electric drive component, taken along the line IX-IX in FIG. 8.

FIGS. 7 to 9 show a seventh exemplary embodiment of a liquid-cooled electric drive component according to the present invention, generally designated by reference numeral 1f.1 FIG. 7 shows a perspective view of the drive component 1, FIG. 8 shows a plan view of the drive component 1, and FIG. 9 shows a cross section through the drive component 1f along the line IX-IX in FIG. 8.

For reasons of clarity, FIG. 7 and FIG. 8 each show the drive component 1 before the first housing part 2 has been welded to the second housing part 3 in a fluid-tight manner.

Similar to the liquid-cooled electric drive component 1a in FIG. 2, the duct inlet 6 is arranged on a surface of the second housing part 3, whereas the duct outlet 7 is arranged on a surface of the first housing part 2. Thus the cooling duct 5 extends from the second housing part 3 via the region containing the fluid-tight welded joint 4 to the first housing part 2.

Figure 10:
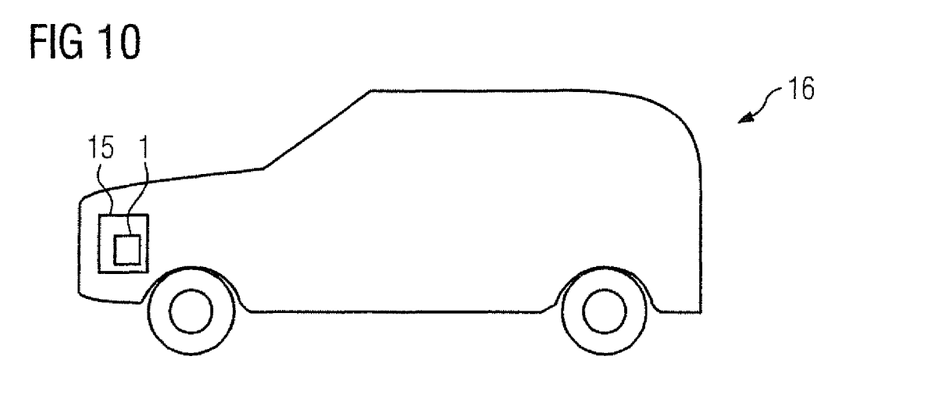
FIG. 10 is a schematic illustration of a vehicle having incorporated a powertrain in accordance with the present invention.

FIG. 10 is a schematic illustration of a vehicle, generally designated by reference numeral 16 having incorporated a powertrain 15 in accordance with the present invention. The powertrain 15 includes a liquid-cooled electric drive component, as described in connection with any of the FIGS. 1-7, and generally designated here for sake of simplicity by reference numeral 1. The vehicle 16 in turn includes the powertrain 15 and in particular is in the form of a hybrid vehicle or electric vehicle.

To summarize, the invention relates to a liquid-cooled electric drive component for a powertrain of a vehicle, in particular of a hybrid vehicle or electric vehicle, which drive component includes a first housing part and at least a second housing part. In order to provide a simple and reliable construction for conducting coolant in the described liquid-cooled electric drive component, and/or to equip accordingly the powertrain and/or the vehicle, it is proposed that the first housing part and the second housing part are joined together by a fluid-tight welded joint. The first housing part and the second housing part, which is welded to the first housing part, are designed such that they form at least a segment of a cooling duct together.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A liquid-cooled electric drive component for a powertrain of a vehicle, comprising a first single-piece housing part and a second single-piece housing part, said first and second single-piece housing parts having flat surfaces and being joined to one another by a fluid-tight welded joint over said flat surfaces and configured such as to form at least a segment of a cooling duct, said cooling duct having a cross section defined by recesses in the first single-piece housing part and the second single-piece housing part and extending along or transversely to the flat surfaces of the first and second single-piece housing parts, said flat surfaces of said first and second single-piece housing parts over which said first and second single-piece housing parts are joined to one another extending continuously over a whole width of said first and second single-piece housing parts and being interrupted only by said cooling duct, wherein the electric drive component is constructed in the form of an inverter which includes at least one power module in thermal contact with the cooling duct, wherein the power module includes a heat sink having at least one part which extends into the cooling duct so that the first single-piece housing part encases the power module except for the at least one part which extends into the cooling duct, said heat sink joined to the first single-piece housing part by a fluid-tight welded joint.

2. The electric drive component of claim 1, wherein the vehicle is a hybrid vehicle or an electric vehicle.

3. The electric drive component of claim 1, wherein the first and second housing parts are joined by laser beam welding or by friction stir welding to establish the fluid-tight welded joint.

4. The electric drive component of claim 1, wherein the first single-piece housing part includes a material which is different from a material of the second single-piece housing part.

5. The electric drive component of claim 1, wherein the first single-piece housing part is a die-cast part and has a contact surface, said second single-piece housing part resting upon the contact surface, said fluid-tight welded joint being formed on the contact surface.

6. The electric drive component of claim 5, wherein the contact surface is untreated.

7. The electric drive component of claim 1, wherein the second single-piece housing part is a member selected from the group consisting of a molded sheet metal part, a casting, a drop-forged part, and a forged part.

8. A liquid-cooled electric drive component for a powertrain of a vehicle, said liquid-cooled electric drive component constructed in the form of an inverter which includes at least one power module in thermal contact with a cooling duct, said liquid-cooled electric drive component comprising:

a first housing part which encases at least part of the power module, said first housing part including an aperture, said power module being arranged on one side of the aperture and said cooling duct being arranged on another side of the aperture;

a second housing part, said first and second housing parts having flat surfaces and being joined to one another by a fluid-tight welded joint over said flat surfaces and configured such as to form at least a segment of the cooling duct, said cooling duct having a cross section defined by recesses in the first housing part and the second housing part and extending along or transversely to the flat surfaces of the first and second housing parts, and a third housing part arranged in the aperture and including a third material having a thermal conductivity which is greater than a thermal conductivity of a material of the first housing part, said first and third housing parts being joined to one another by a further fluid-tight welded joint.

9. The electric drive component of claim 8, wherein the first and third housing parts are joined by laser beam welding or by friction stir welding to establish the further fluid-tight welded joint.

10. A method for producing a liquid-cooled electric drive component, comprising;
   die-casting a first single-piece housing part having a flat surface;
   placing a second single-piece housing part having a flat surface on the flat surface of the first single-piece housing part; and
   joining the first and second single-piece housing parts by a fluid-tight welded joint at the flat surfaces such as to form a cooling duct defined by recesses in a wall of the first single-piece housing part and the second single-piece housing part and extending along or transversely to the flat surfaces of the first and second single-piece housing parts, and
   extending said flat surfaces of said first and second single-piece housing parts over which said first and second single-piece housing parts are joined to one another continuously over a whole width of said first and second single-piece housing parts so that they are interrupted only by said cooling duct,
   wherein the electric drive component is constructed in the form of an inverter which includes at least one power module in thermal contact with the cooling duct, wherein the power module includes a heat sink having at least one part which extends into the cooling duct so that the first single-piece housing part encases the power module except for the at least one part which extends into the cooling duct, said heat sink joined to the first single-piece housing part by a fluid-tight welded joint.

11. The method of claim 10, wherein the contact surface is untreated.

12. A powertrain for a vehicle, comprising a liquid-cooled electric drive component which includes a first single-piece housing part having a flat surface and a second single-piece housing part having a flat surface, said first and second single-piece housing parts being joined to one another by a fluid-tight welded joint at the flat surfaces and configured such as to form a segment of a cooling duct, said cooling duct having a cross section defined by recesses in a wall of the first single-piece housing part and the second single-piece housing part, said flat surfaces of said first and second single-piece housing parts over which said first and second single-piece housing parts are joined to one another extending continuously over a whole width of said first and second single-piece housing parts and being interrupted only by said cooling duct, wherein the electric drive component is constructed in the form of an inverter which includes at least one power module in thermal contact with the cooling duct, wherein the power module includes a heat sink having at least one part which extends into the cooling duct so that the first single-piece housing part encases the power module except for the at least one part which extends into the cooling duct, said heat sink joined to the first single-piece housing part by a fluid-tight welded joint.

13. The powertrain of claim 12, wherein the first single-piece housing part includes a material which is different from a material of the second single-piece housing part.

14. The powertrain of claim 12, wherein the first single-piece housing part is a die-cast part and has a contact surface, said second housing part resting upon the contact surface, said fluid-tight welded joint being formed on the contact surface.

15. The powertrain of claim 12, wherein the electric drive component is constructed in the form of an inverter which includes at least one power module in thermal contact with the cooling duct, said first single-piece housing part encasing at least part of the power module.

16. The powertrain of claim 15, wherein the power module includes a heat sink having at least one part which extends into the cooling duct.

17. A vehicle, comprising:
   a liquid-cooled electric drive component which includes a first single-piece housing part and a second single-piece housing part, said first and second single-piece housing parts having flat facing surfaces and being joined to one another by a fluid-tight welded joint over said flat facing surfaces and configured such as to form a segment of a cooling duct, said cooling duct having a cross section defined by recesses in the first single-piece housing part and the second single-piece housing part and extending along or transversely to the flat facing surfaces of the first and second single-piece housing parts, said flat facing surfaces of said first and second single-piece housing parts over which said first and second single-piece housing parts are joined to one another extending continuously over a whole width of said first and second single-piece housing parts and being interrupted only by said cooling duct;
   wherein the electric drive component is constructed in the form of an inverter which includes at least one power module in thermal contact with the cooling duct, wherein the power module includes a heat sink having at least one part which extends into the cooling duct so that the first single-piece housing part encases the power module except for the at least one part which extends into the cooling duct, said heat sink joined to the first single-piece housing part by a fluid-tight welded joint; and/or
   a powertrain comprising said liquid-cooled electric drive component.

18. The vehicle of claim 17, constructed as a hybrid vehicle or an electric vehicle.

* * * * *